United States Patent [19]

Kouyama et al.

[11] Patent Number: 5,332,770
[45] Date of Patent: Jul. 26, 1994

[54] ELECTRONIC DEVICE SEALING RESIN COMPOSITIONS AND SEALED ELECTRONIC DEVICES

[75] Inventors: Toshitaka Kouyama; Keiichiro Suzuki; Toshio Enoki; Yasuo Sakaguchi, all of Iwaki, Japan

[73] Assignee: Kureha Kagaku Kogyo K.K., Tokyo, Japan

[21] Appl. No.: 925,331

[22] Filed: Aug. 6, 1992

Related U.S. Application Data

[63] Continuation of Ser. No. 431,119, Nov. 3, 1989, abandoned.

[30] Foreign Application Priority Data

Nov. 12, 1988 [JP] Japan ............... 63-284836
Sep. 26, 1989 [JP] Japan ............... 1-248087

[51] Int. Cl.$^5$ ............................................. C08K 5/24
[52] U.S. Cl. ................................ 524/262; 524/265; 524/267
[58] Field of Search ................. 524/262, 265, 267

[56] References Cited

U.S. PATENT DOCUMENTS

| | | | |
|---|---|---|---|
| 3,929,708 | 12/1975 | Brady et al. | 524/267 |
| 4,370,292 | 1/1983 | Yanase et al. | 525/474 |
| 4,395,527 | 7/1983 | Berger | 524/323 |
| 4,474,906 | 10/1984 | Nakama et al. | 524/496 |
| 4,703,075 | 10/1987 | Egami | 524/269 |
| 4,785,057 | 11/1988 | Shiiki et al. | 524/609 |
| 4,797,448 | 1/1989 | Liang et al. | 524/262 |
| 4,895,892 | 1/1990 | Satake et al. | 525/471 |
| 4,895,893 | 1/1990 | Satake et al. | 525/471 |

FOREIGN PATENT DOCUMENTS

| | | | |
|---|---|---|---|
| 135845 | 10/1979 | Japan . | |
| 20911 | 2/1984 | Japan . | |
| 197451 | 9/1987 | Japan . | |
| 219145 | 9/1988 | Japan | 524/265 |
| 219146 | 9/1988 | Japan . | |
| 219147 | 9/1988 | Japan | 524/262 |

Primary Examiner—John C. Bleutge
Assistant Examiner—Karen A. Dean
Attorney, Agent, or Firm—Lowe, Price, LeBlanc & Becker

[57] ABSTRACT

Disclosed herein are electronic device sealing resin compositions containing (A) 40-25 parts by weight of a thermoplastic resin composed of 100-10 wt. % of a poly(arylene thioether-ketone) and 0-90 wt. % of a poly(arylene sulfide), (B) 60-75 parts by weight of an inorganic filler, and per 100 parts by weight of the sum of the thermoplastic resin (A) and inorganic filler (B), (C) 1.5-5 parts by weight of a silicone oil, (D) 10-15 parts by weight of a silicone rubber or (C) 0.5-3 parts by weight of a silicone oil and (D) 5-13 parts by weight of a silicone rubber. Electronic devices sealed using such resin compositions are also disclosed.

8 Claims, No Drawings

ELECTRONIC DEVICE SEALING RESIN COMPOSITIONS AND SEALED ELECTRONIC DEVICES

This application is a continuation of application Ser. No. 07/431,119 filed Nov. 3, 1989, now abandoned.

FIELD OF THE INVENTION

The present invention relates to resin compositions for sealed electronic devices, which have excellent moisture resistance and solder heat resistance. More specifically, the present invention is concerned with electronic device sealing resin compositions, each of which uses a resin composition blended as a thermoplastic resin with a poly(arylene thioether-ketone) (hereinafter abbreviated as "PTK") or a mixture of PTK and a poly(arylene sulfide) (hereinafter abbreviated as "PAS"), and also with sealed electronic devices obtained using the resin compositions.

BACKGROUND OF THE INVENTION

It is widely practiced to seal electronic devices, for example, transistors, diodes, ICs, capacitors and the like with a synthetic resin to retain electrical insulating property and avoid variations in physical properties due to the surrounding atmosphere while enjoying advantages in productivity and cost.

Thermosetting resins such as epoxy resins and silicone resins have conventionally employed as synthetic sealing resins. They are however said to have drawbacks such that they require a long time for thermosetting and hence a long molding cycle, their storage is not easy because of the need for prevention of the progress of curing, and sprues and runners cannot be reused.

Therefore, it has recently been proposed to use, as electronic device sealing resin compositions, resin compositions composed principally of a polyphenylene sulfide (hereinafter abbreviated as "PPS") which is a thermoplastic resin having excellent heat resistance and flame retardance. Reference may be had, for example, to Japanese Patent Publication No. 9014/1981, Japanese Patent Application Laid-Open No. 17153/1982, Japanese Patent Application Laid-Open No. 21844/1982, Japanese Patent Application Laid-Open No. 40557/1982, Japanese Patent Application Laid-Open No. 20910/1984, Japanese Patent Application Laid-Open No. 20911/1984, Japanese Patent Publication No. 40188/1985, Japanese Patent Application Laid-Open No. 65351/1987, Japanese Patent Application Laid-Open No. 197451/1987, and Japanese Patent Application Laid-Open No. 146963/1988).

A PPS resin however has inferior adhesion to lead frames or bonding wires of an electronic device. When sealing is conducted with a PPS resin composition and the resultant sealed electronic device is placed in a high-humidity atmosphere, moisture tends to penetrate through an interface between the sealing resin and the lead frames or bonding wires so that the electrical insulating property may be reduced and/or the lead frames and wires may be corroded and the electrical characteristics of the electronic device may be reduced accordingly.

An electronic device is mounted on a circuit board. Its bonding to the board is achieved by a solder. Reflecting the recent diversification of board-mounted devices in both configurations and dimensions, soldering apparatus increasingly employ a temperature higher than conventional temperatures to ensure successful bonding of larger devices to a board. As a result, smaller devices which are mounted on the board concurrently with the larger devices are increasingly required to have far higher solder heat resistance compared to the larger devices since the smaller devices have a relatively smaller heat capacity. For example, with respect to devices for which the heat resistance of about 260° C. as measured by a method to be set out subsequently has heretofore been considered sufficient, there is a recent and increasing trend toward the need for durability against higher temperatures. Otherwise, sealing materials inside such electronic devices may be deteriorated or interfacial separation and cracks may occur between the resin portions and the lead frames, so that the electronic devices may no longer be suitable for use.

A sealed electronic device is required to have excellent moisture resistance and solder heat resistance as described above. Where conventional PPS resin compositions are used as sealing resin compositions, their moisture resistance and solder heat resistance are still insufficient. This has remained as a problem for their actual use.

OBJECTS AND SUMMARY OF THE INVENTION

An object of the invention is to provide a resin composition for sealed electronic devices, which has excellent moisture resistance and solder heat resistance.

Another object of the invention is to obtain sealed electronic devices obtained using an electronic device sealing resin composition having such excellent properties.

With a view toward solving the problems of the prior art techniques, the present inventors have carried out an extensive investigation. As a result, it has been found that the use of PTK as a thermoplastic resin, said PTK having excellent melt stability and higher heat resistance than PPS, either alone or in combination with PAS is effective for the improvement of the solder heat resistance. For the improvement of the moisture resistance, it has been found effective to lower the coefficient of linear expansion of each resin portion by blending an inorganic filler in a high proportion and also to reduce the modulus of elasticity by the incorporation of a silicone oil and/or a silicone rubber. These findings have led to completion of the invention.

In one aspect of the invention, there is thus provided an electronic device sealing resin composition comprising:

(A) 40–25 parts by weight of a thermoplastic resin composed of 100–10 wt. % of a poly(arylene thioether-ketone) and 0–90 wt. % of a poly(arylene sulfide);

(B) 60–75 parts by weight of an inorganic filler; and (C) 1.5–5 parts by weight, per 100 parts by weight of the sum [(A)+(B)] of the thermoplastic resin (A) and inorganic filler (B), of a silicone oil.

In another aspect of the invention, there is also provided an electronic device sealing resin composition comprising:

(A) 40–25 parts by weight of a thermoplastic resin composed of 100–10 wt. % of a poly(arylene thioether-ketone) and 0–90 wt. % of a poly(arylene sulfide);

(B) 60–75 parts by weight of an inorganic filler; and (C) 10-15 parts by weight, per 100 parts by weight of the sum [(A)+(B)] of the thermoplastic resin (A) and inorganic filler (B), of a silicone rubber.

In a further aspect of the invention, there is also provided an electronic device sealing resin composition comprising:

(A) 40-25 parts by weight of a thermoplastic resin composed of 100-10 wt. % of a poly(arylene thioether-ketone) and 0-90 wt. % of a poly(arylene sulfide);

(B) 60-75 parts by weight of an inorganic filler; and (C) 0.5-3 parts by weight of a silicone oil and 5-13 parts by weight of a silicone rubber, both, per 100 parts by weight of the sum [(A)+(B)] of the thermoplastic resin (A) and inorganic filler (B).

In a still further aspect of the invention, there is also provided a sealed electronic device obtained using any one of these resin compositions.

DETAILED DESCRIPTION OF THE INVENTION

The individual components of the invention will hereinafter be described in detail.

Poly(Arylene Thioether-Ketone) (PTK)

PTKs usable in the invention are poly(arylene thioether-ketones) having predominant recurring units of the formula

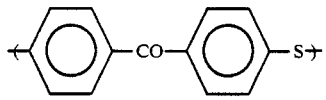

wherein the —CO— and —S— are in the para position to each other. Preferably, PTKs employed in this invention may contain the above recurring units in a proportion of at least 50 wt. %, more preferably 60 wt. % or higher, most preferably 70 wt. % or higher. If the proportion of the recurring units is smaller than 50 wt. %, there is a potential problem that the crystallinity of the polymer may be reduced and its heat resistance may be reduced correspondingly.

Exemplary recurring units other than the above recurring units may include various units, such as diphenylsulfone sulfide units, diphenyl sulfide units, diphenyl ether sulfide units and 2,6-naphthalene sulfide units.

It is preferable that melt-stable PTKs used in this invention are uncured polymers, with uncured linear polymers being more preferred. PTKs having a partially crosslinked and/or branched structure to such an extent that melt stability, flowability and crystallinity are not impaired are also acceptable.

To be polymers having high heat resistance, melt processability and excellent mechanical strength, the PTKs employed in the invention may preferably have the following physical properties.

(a) As indices of their excellent heat resistance, their melting points, Tm range from 310° to 380° C.

(b) As indices of the melt stability of the polymers, their melt crystallization temperature, Tmc (420° C./10 min) are at least 210° C. and their residual melt crystallization enthalpies, ΔHmc (420° C./10 min) are at least 10 J/g.

Incidentally, Tmc (420° C./10 min) and ΔHmc (420° C./10 min) are the temperature corresponding to a peak of melt crystallization of each PTK measured by a differential scanning calorimeter (hereinafter abbreviated as "DSC") and the residual melt crystallization enthalpy of the PTK as calculated from its peak area, respectively when the PTK was cooled at a cooling rate of 10° C./min after the PTK is held at 50° C. for 5 minutes in an inert gas atmosphere, heated to 420° C. at a rate of 75° C./min and then held for 10 minutes at 420° C.

Further, as an index of melt stability, the melt viscosity increment in terms of times of each polymer can also be used. Each PTK usable in this invention should have a melt viscosity increment, $\eta^*(385° C./30 min)/\eta^*(385° C./5 min)$ of 10 or smaller, wherein $\eta^*(385° C./30 min)$ and $\eta^*(385° C./5 min)$ are the melt viscosities of the PTK at 385° C. and a shear rate of 1200 sec$^{-1}$ after the PTK is held at 385° C. for 30 minutes and 5 minutes, respectively.

(c) As indices of the molecular weights of the polymers, their reduced viscosities, $\eta_{red}$ should be within a range of 0.2-2 dl/g.

In the present invention, each reduced viscosity, $\eta_{red}$ is expressed by a value as determined by viscosity measurement at 25° C. and a polymer concentration of 0.5 g/dl in 98 wt. % sulfuric acid as a solvent.

(d) As indices of the characteristics of crystalline polymers, the densities of the polymers obtained in a crystallized form by annealing them at 280° C. for 30 minutes are at least 1.34 g/cm$^3$ at 25° C.

Such melt-stable PTKs can be suitably produced, for example, by subjecting an alkali metal sulfide and a dihalogenated aromatic compound, preferably, a dihalogenated aromatic compound consisting principally of 4,4'-dichlorobenzophenone and/or 4,4'-dibromobenzophenone to a dehalogenation or sulfuration reaction under the following conditions (a)-(c) in an aprotic polar organic solvent, preferably, in an organic amide solvent:

(a) ratio of the water content to the amount of the charged organic amide solvent being within a range of 2.5-15 (mol/kg);

(b) ratio of the amount of the charged dihalogenated aromatic compound to the amount of the charged alkali metal sulfide being within a range of 0.95-1.2 (mol/mol); and (c) reaction temperature being within a range of 60°-300° C. with a proviso that the reaction time at 210° C. and higher is within 10 hours.

The melt-stable PTK can be obtained more suitably when a reactor at least a portion of which, said portion being brought into contact with the reaction mixture, is made of a titanium material.

A PTK improved still further in melt stability can also be obtained by adding at least one halogen-substituted aromatic compound having at least one substituent group of electron-withdrawing property at least equal to —CO— group (preferably, the dihalogenated aromatic compound employed as the monomer) to the aforementioned PTK and reacting them together (as a stabilization treatment in a final stage of the polymerization).

Such PTKs, which feature excellent heat resistance, melt stability and the like, can be produced by the process disclosed in Japanese Patent Application Laid-Open No. 54031/1989.

Poly(Arylene Sulfide) (PAS)

PASs useful in the practice of the invention are poly(arylene sulfides) containing at least 50 wt. %, more preferably at least 70 wt. %, most preferably at least 90 wt. % of p-phenylene sulfide recurring units

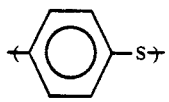

as predominant structural units thereof. Those having a substantially-linear structure are preferred. PASs having such a structure are polymers which are each obtained from a monomer consisting essentially of a bifunctional monomer. Since p-phenylene sulfide units account for 50 wt. % or higher such a PAS, the PAS may contain less than 50 wt. % of other copolymerizable structural units. As such structural units, may be mentioned m-phenylene sulfide units, diphenylsulfone sulfide units, diphenyl sulfide units, diphenyl ether sulfide units, 2,6-naphthalene sulfide units, etc. Further, block copolymers formed of 70-95 wt. % of p-phenylene sulfide recurring units and 5-30 wt. % of m-phenylene sulfide recurring units can also be used preferably.

Preferred as the PAS in the invention is that having a melting point higher than 250° C. If the melting point of the PAS is 250° C. or lower, the PAS has inferior properties as a heat-resistant resin.

Such a PAS can be suitably obtained by reacting an alkali metal sulfide and a dihalogenated aromatic compound in the presence of water in an organic amide solvent such as N-methyl-pyrrolidone by a particular two-stage heat-up polymerization process as disclosed in Japanese Patent Publication No. 33775/1988.

Inorganic Filler

As exemplary inorganic fillers usable in the invention, may be mentioned particulate or powdery fillers such as silica, alumina, talc, mica, kaolin, clay, silica-alumina, titanium oxide, calcium carbonate, calcium silicate, calcium phosphoate, calcium sulfate, magnesium carbonate, magnesium oxide, magnesium phosphate, silicon nitride, glass, hydrotalcite and zirconium oxide; and fibrous fillers such as glass fibers, potassium titanate fibers and mica ceramic fibers. These inorganic fillers can be used either singly or in combination.

These inorganic fillers can also be used after treating them with a silane coupling agent or a titanate coupling agent.

Silicone Oil

The silicone oil employed in the invention can be a polyorganosiloxane such as polydimethylsiloxane or polymethylphenylsiloxane; or a modified silicone oil obtained by partially modifying an unmodified polyorganosiloxane with functional groups such as epoxy, hydroxyl, amino, carboxyl, methacryloxy and/or mercapto groups.

Although no particular limitation is imposed on the viscosity of the silicone oil, silicone oils having a viscosity of 10-10,000 centistokes (at 25° C.) are preferred.

Silicone Rubber

Silicone rubbers usable in the invention include methyl silicone rubber, vinyl-methyl silicone rubber, phenyl-methyl silicone rubber, fluorinated silicone rubber, and the like. They can be used either singly or in combination.

Proportions of Individual Components

Employed as the thermoplastic sealing resin in the invention is a PTK alone or a resin composition obtained by blending 0-90 wt. % of a PAS to 100-10 wt. % of a PTK.

Use of a PTK as a sole thermoplastic resin leads to a composition which features excellent solder heat resistance in particular. Blending of a PAS to a PTK can provides a resin composition in which solder heat resistance and economy are well-balanced. Of such resin compositions, those obtained by blending 0-70 wt. %, preferably 0-50 wt. % of a PAS to 100-30 wt. %, preferably 100-50 wt. % of a PTK have superb solder heat resistance. On the other hand, those obtained by blending 50-90 wt. % of a PAS to 50-10 wt. % of a PTK have better solder heat resistance than the PAS alone and are preferred especially from the economical standpoint. However, PAS proportions greater than 90 wt. %, are too much to substantially improve the solder heat resistance. It is therefore not preferred to use a PAS in such a large proportion.

The inorganic filler is blended in a proportion of 60-75 parts by weight per 40-25 parts by weight of the thermoplastic resin consisting of a PTK alone or a PTK-PAS composition, with the proviso that the sum of the inorganic filler and thermoplastic resin is 100 parts by weight. Proportions of the inorganic filler smaller than 60 parts by weight are too little to provide resin portions having a sufficiently reduced coefficient of linear expansion, so that the resultant sealed electronic devices will be inferior in moisture resistance, If the inorganic filler is added in proportions greater than 75 parts by weight on the other hand, the resulting resin compositions will have an increased viscosity so that they will have inferior moldability as sealing resin compositions, The silicone oil is used in a proportion of 1.5-5 parts by weight-per 100 parts by weight of the sum of the thermoplastic resin and inorganic filler. Proportion of the silicone oil smaller than 1.5 parts by weight are too small to provide resin portions having a sufficiently-lowered modulus of elasticity so that the resultant sealed electronic devices will be inferior in moisture resistance, Proportions greater than 5 parts by weight will however result in mechanical strength reduced excessively as sealing moldings and will undergo bleeding upon molding. It is thus not preferred to use the silicone oil in proportions outside the above range.

The silicone rubber is blended in a proportion of 10-15 parts by weight per 100 parts by weight of the sum of the thermoplastic resin and inorganic filler. Proportion of the silicone rubber smaller than 10 parts by weight are too small to sufficiently lower the modulus of elasticity. Proportions greater than 15 parts by weight will however result in an excessive reduction of the mechanical strength and moreover in an unduly high melt viscosity upon molding, so that bonding wires and the like will be damaged.

When silicone oil and silicone rubber are used in combination, they should be used in proportions of 0.5-3 parts by weight and 5-13 parts by weight, respectively per 100 parts by weight of the sum of the thermoplastic resin and inorganic filler from the standpoint of balancing between the reduction of modulus of elasticity and the mechanical strength of resulting moldings.

By using the above specific components in their respective proportions specified above, the invention can provide a sealing resin composition excellent in solder heat resistance, moisture resistance and moldability.

The melt viscosity of the sealing resin composition employed in the invention can preferably be, but is not particularly limited to, 100–500 poises as measured at 380° C. and a shear rate of 10,000 sec$^{-1}$.

No particular limitation is imposed on the method for blending the individual components. Any method widely employed in general can be employed, for example, the blending of the individual components in a mixer such as a Henschel mixer. No particular limitation is imposed either on the method for molding the resin composition of this invention. Any conventional molding method such as injection molding can be adopted.

Further, the resin composition of this invention can be blended with various additives such as antioxidants, heat stabilizers and colorants, as needed.

ADVANTAGES OF THE INVENTION

According to the invention, resin compositions for sealed electronic devices, which are excellent in moisture resistance and solder heat resistance, can be obtained.

In addition, according to the invention, sealed electronic devices excellent in moldability, moisture resistance, surface appearance and the like can be obtained by sealing the corresponding electronic devices with such an electronic device sealing resin composition of excellent properties.

EMBODIMENTS OF THE INVENTION

The invention will hereinafter be described specifically by the following Examples, Synthesis Experiments and Comparative Examples. It should however be borne in mind that the invention is not limited to the following Examples only. cl SYNTHESIS EXPERIMENT 1

(Synthesis of PTK)

A titanium-lined reactor was charged with 96 moles of 4,4'-dichlorobenzophenone (hereinafter abbreviated as "DCBP"; product of Ihara Chemical Industry Co., Ltd.), 95 moles of hydrated sodium sulfide (water content: 54.0 wt. %; product of Sankyo Kasei Co., Ltd.) and 95 kg of N-methylpyrrolidone (hereinafter abbreviated as "NMP") (water content/NMP = 5 mol/kg). After the reactor being purged with nitrogen gas, the resultant mixture was heated from room temperature to 240° C. over 2.2 hours and then maintained at 240° C. for 1 hour to conduct a reaction. In order to apply stabilization treatment in a final stage of the polymerization, 4.75 moles of DCBP, 19 kg of NMP and 95 moles of water were added, followed by a reaction at 240° C. for additional 1 hour.

After cooling the reactor, the reaction mixture in the form of a slurry was taken out of the reactor and was then poured into about 200 liters of acetone to cause the resultant polymer to precipitate. The precipitate was collected by filtration, and then washed twice with acetone and further twice with water. Acetone and water were removed to obtain a wet polymer. The thus-obtained wet polymer was dried at 80° C. under reduced pressure for 12 hours, thereby obtaining a PTK as an ivory powder.

The melting point, Tmc (420° C./10 min) and ΔHmc (420° C./10 min) of the PTK were 360° C., 290° C. and 43 J/g. Its density was 1.30 g/cm$^3$ in an amorphous form and 1.35 g/cm$^3$ in an annealed form, both at 25° C., while its $\eta_{red}$ was 0.42 dl/g.

<Measuring methods of physical properties>

MELTING POINT, Tm

About 10 mg of the PTK (powder) were weighed. Using a DSC (Model TC 10A; manufactured by Mettler Company), the sample was held at 50° C. for 5 minutes in an inert gas atmosphere and then heated up at a rate of 10° C./min so as to measure its melting point.

RESIDUAL MELT CRYSTALLIZATION ENTHALPY, ηHmc AND MELT CRYSTALLIZATION TEMPERATURE, Tmc

About 10 mg of the PTK (powder) were weighed. After holding the sample at 50° C. for 5 minutes in an inert gas atmosphere by using the DSC, it was heated at a rate of 75° C./min up to 420° C. and held at that temperature for 10 minutes. While cooling the sample at a rate of 10° C./min, its residual melt crystallization enthalpy, ηHmc (420° C./10 min) and its melt crystallization temperature, Tmc (420° C./10 min) were measured.

DENSITY

A portion of the PTK (powder) was placed between two sheets of polyimide film ("Kapton"; product of E. I. du Pont de Nemours & Co., Inc.). It was preheated at 385° C. for 2 minutes and then press-formed at 385° C. for 0.5 minute by a hot press. It was then quenched to obtain an amorphous sheet which was about 0.15 mm thick. A part of the amorphous sheet was used directly as a sample, while the remaining part was annealed at 280° C. for 30 minutes to use it as an annealed sample with an increased degree of crystallization. Their densities were measured at 25° C. by means of a density gradient tube of the lithium bromide/water system.

REDUCED VISCOSITY, $\eta_{red}$

A portion of the PTK was dissolved in 98 wt. % sulfuric acid to give a polymer concentration of 0.5 g/dl. The viscosity of the resultant solution was then measured at 25° C. by means of a Ubbellohde viscometer.

EXAMPLE 1

To 100 parts by weight of a composition obtained by mixing 65 parts by weight of silica ("P-447K"; fused silica produced by Nippon Electric Glass Co., Ltd.) with 35 parts by weight of a mixture which consisted of 90 wt. % of a polyphenylene sulfide (PPS produced by Kureha Chemical Industry Co., Ltd.; obtained by the process of Japanese Patent Publication No. 33775/1988, using paradichlorobenzene and sodium sulfide as sole monomers; melt viscosity: 35 poises as measured at 310° C. and a shear rate of 10,000 sec$^{-1}$) and 10 wt. % of a PTK (the polymer obtained in Synthesis Experiment 1), 2.5 parts by weight of a silicone oil ("XF42-744"; an epoxy-modified silicone oil produced by Toshiba Silicone Co., Ltd.; viscosity, 700 centistokes) were intimately blended in a Henschel mixer. The resultant blend was extruded at a resin temperature of 360° C. into pellets by means of a twin-screw extruder having a screw diameter of 45 mm.

The pellets were then injection-molded at a resin temperature of 360° C. and a mold temperature of 200° C. to prepare test pieces (dimensions: 130×12.7×3.2 mm): Using those test pieces, the solder heat resistant temperature was measured. The results are shown in Table 1.

<Measuring method>

SOLDER HEAT RESISTANT TEMPERATURE

Solder baths of varied bath temperatures were provided. The test pieces were immersed for 60 seconds in the baths, respectively. After the immersion, each test piece was visually inspected to determine if any swell or deformation had occurred as a change in external appearance. Among the solder baths which did not change the external appearance of the corresponding test pieces, the highest bath temperature was recorded as a solder heat resistant temperature.

EXAMPLES 2–5

In a similar manner to Example 1 except that the composition of the thermoplastic resin components was changed to 70 wt. % of the PPS and 30 wt % of the PTK in Example 2, 50 wt. % of the PPS and 50 wt. % of the PTK in Example 3, 25 wt. % of the PPS and 75 wt. % of the PTK in Example 4 and the PTK alone in Example 5, test pieces were molded and then evaluated.

Comparative Example 1

In a similar manner to Example 1 except that the resin components were changed to the PPS alone and the resin temperature was lowered to 320° C. test pieces were molded and then evaluated.

The results of Examples 1–5 and Comparative Example 1 are collectively shown in Table 1.

As will become apparent from Table 1, the resin compositions according to the invention had been improved in solder heat resistance compared to the use of the PPS as a sole resin component. The solder heat resistant temperatures of 270° C. and higher are improvements which are extremely important from the practical viewpoint.

TABLE 1

| | Examples | | | | | Comp. Ex. |
|---|---|---|---|---|---|---|
| | 1 | 2 | 3 | 4 | 5 | 1 |
| Resin component | | | 35 parts | | | 35 parts |
| PTK (%) | 10% | 30% | 50% | 75% | 100% | 0% |
| PPS (%) | 90% | 70% | 50% | 25% | 0% | 100% |
| Inorganic filler | | | | | | |
| Silica | | | 65 parts | | | 65 parts |
| Silicone oil | | | 2.5 parts | | | 2.5 parts |
| Solder heat resistant temp. (°C.) | 270 | 280 | 300 | 310 | 330 | 260 |

Note:
In the table, "parts" and "%" are all by weight.

EXAMPLE 6

In a similar manner to Example 1 except for the change in proportions that 2 parts by weight of the silicone oil were added to 100 parts by weight of the composition formed by blending 65 parts by weight of silica with 35 parts by weight of a mixture consisting of 50 wt. % of the PPS and 50 wt. % of the PTK, pellets were produced using a twin-screw extruder.

Using a portion of the pellets, the melt viscosity was measured. In addition, injection molding was conducted under the same conditions as in Example 1, whereby test pieces were produced. The solder heat resistant temperature, flexural strength and modulus of flexural elasticity were measured.

Also using a portion of the pellets, molding, i.e., sealing was conducted under the following molding conditions: 360° C. resin temperature, 200° C. mold temperature, 18 cm$^3$/sec injection speed and 400 kgf/cm$^2$ holding pressure. As a result, molded TO-92 transistors (JEDEC specification, TO-92; 5.0 mm×4.5 mm×4.0 mm) were obtained.

With respect to the sealed electronic devices thus obtained, a moisture resistance test was conducted. Further, they were visually inspected to determine if the silicone oil bled to the surfaces of the molded devices and if wire sweep (disconnection) took place upon sealing.

<Measuring methods>

Melt viscosity: Measured at 380° C. and a shear rate of 10,000 sec$^{-1}$.

Flexural strength: ASTM D790.

Modulus of flexural strength: ASTM D790.

Moisture resistance test: Moisture resistance tests were conducted using sealed electronic devices which were free of wire sweep upon sealing or damages to packages upon cutting lead frames. In Moisture Resistance Testing Method A, each sealed electronic device was immersed at 120° C. under 2 atm for 24 hours in a red ink and the degree of penetration of the red ink into the metal surface was observed. In Moisture Resistance Testing Method B, each sealed electronic device was placed for 24 hours in an atmosphere of 85° C. and 85% humidity. After dipping the lead frames alone for 10 seconds in a solder bath of 260° C., a red ink was allowed to penetrate in a similar manner to Method A. The degree of its penetration was observed likewise.

A: Small degree of penetration.

B: Intermediate degree of penetration.

C: Great degree of penetration.

Surface quality of molded devices: The degree of bleeding of the silicone oil was visually inspected on the surface of each sealed electronic device and was also judged by the feeling to hand touch.

A: Little bleeding.

B: Considerable bleeding.

Wire sweep upon sealing: Wire sweep (disconnection) upon sealing was visually inspected by soft x-rays.

A: Little wire sweep.

B: Considerable wire sweep.

EXAMPLE 7:

To 100 parts by weight of a composition obtained by blending 50 parts by weight of silica and 15 parts by weight of glass fibers (product of Nippon Electric Glass Co., Ltd.; fiber length: 3 mm; fiber diameter: 6 μm) with 35 parts by weight of a mixture which consisted of 50 wt. % of the PPS and 50 wt. % of the PTK, 2.5 parts by weight of the silicone oil were added. After forming the resultant blend into pellets in a similar manner to Example 1, test pieces and sealed electronic devices were molded in a similar manner to Example 6. They were evaluated similarly.

EXAMPLE 8

In a similar manner to Example 6 except that the proportion of the silicone oil was changed to 5 parts by weight, test pieces and sealed electronic devices were molded and then evaluated.

EXAMPLES 9–11

In a similar manner to Example 6 except that the proportions of the thermoplastic resin components were changed to 70 wt. % of the PPS and 30 wt. % of the PTK in Example 9, to 25 wt. % of the PPS and 75 wt. % of the PTK in Example 10 and to the PTK alone in Example 11, test pieces and sealed electronic devices were molded and then evaluated.

COMPARATIVE EXAMPLES 2–4

In a similar manner to Example 6 except that no silicone oil was added in Comparative Example 2 and the proportion of the silicone oil was changed to 1 part by weight in Comparative Example 3 and to 7 parts by weight in Comparative Example 4, test pieces were molded and then evaluated.

COMPARATIVE EXAMPLE 5

In a similar manner to Example 6 except that the proportions of the thermoplastic resin components were changed to the PPS alone, test pieces and sealed electronic devices were molded and then evaluated.

The results of Examples 6–11 and Comparative Examples 2–5 are collectively summarized in Table 2.

EXAMPLE 12

In a similar manner to Example 6 except for the change in proportions that 10 parts by weight of a silicone rubber ("E-501"; product of Toray Silicone Co., Ltd.) were added to 100 parts by weight of the composition formed by blending 65 parts by weight of silica with 35 parts by weight of a mixture consisting of 50 wt. % of the PPS and 50 wt. % of the PTK, pellets were produced using a twin-screw extruder. Furthermore, test pieces and sealed electronic devices were similarly molded and evaluated.

With respect to the sealed electronic devices, a moisture resistance test was conducted. Further, they were visually inspected to determine if wire sweep (disconnection) took place upon sealing and if the packages were damaged upon cutting the lead frames.

<Measuring method>

Damages to package upon cutting lead frame: A visual judgement was conducted to determine if the package of each sealed electronic device was damaged when the lead frames were cut upon trimming the sealed electronic device or upon cutting the tie bar.

A: Little damages to the package.

B: Considerable damages to the package.

EXAMPLES 13–16

In a similar manner to Example 12 except for the changes that the proportion of the silicone rubber was changed to 15 parts by weight in Example 13, the proportions of the thermoplastic resin components were changes to 70 wt. % of the PPS and 30 wt. % of the

TABLE 2

|  | Example |  |  |  |  |  | Comparative Example |  |  |  |
|---|---|---|---|---|---|---|---|---|---|---|
|  | 6 | 7 | 8 | 9 | 10 | 11 | 2 | 3 | 4 | 5 |
| Resin component (parts) | 35 | 35 | 35 | 35 | 35 | 35 | 35 | 35 | 35 | 35 |
| PTK (%) | 50 | 50 | 50 | 30 | 75 | 100 | 50 | 50 | 50 | 0 |
| PPS (%) | 50 | 50 | 50 | 70 | 25 | 0 | 50 | 50 | 50 | 100 |
| Inorganic filler |  |  |  |  |  |  |  |  |  |  |
| Silica (parts) | 65 | 50 | 65 | 65 | 65 | 65 | 65 | 65 | 65 | 65 |
| Glass fibers (parts) | — | 15 | — | — | — | — | — | — | — | — |
| Silicone oil (parts) | 2 | 2.5 | 5 | 2 | 2 | 2 | — | 1 | 7 | 2 |
| Physical properties of composition |  |  |  |  |  |  |  |  |  |  |
| Melt viscosity (poise) | 265 | 300 | 230 | 260 | 270 | 300 | 400 | 330 | 200 | 260 |
| Flexural strength (kg/mm$^2$) | 4.6 | 7.7 | 4.5 | 4.6 | 4.6 | 4.6 | 6.0 | 5.1 | 4.4 | 4.6 |
| Modulus of flexural elasticity (kg/mm$^2$) | 1000 | 1250 | 980 | 1000 | 1000 | 1000 | 1300 | 1250 | 980 | 1000 |
| Solder heat resistant temperature (°C.) | 300 | 300 | 300 | 280 | 310 | 330 | 300 | 300 | 290 | 260 |
| Moisture resistance test |  |  |  |  |  |  |  |  |  |  |
| Method A | A | A | A | A | A | A | C | C | B | A |
| Method B | A | A | A | A | A | A | C | C | B | A |
| Surface quality of molded product (bleeding) | A | A | A | A | A | A | A | A | B | A |
| Wire sweep upon sealing (presence or absence?) | A | A | A | A | A | A | A | A | A | A |

(All "%" and "parts" are by weight.)

As is apparent from Table 2, the resin compositions according to the invention had a low melt viscosity upon molding and retained mechanical strength and had a low coefficient of elasticity. Moreover, the sealed electronic devices had excellent moisture resistance. The resin compositions of the invention can therefore provide sealed electronic devices having good physical properties. In contrast, the resin compositions outside the range of the invention were inferior in moisture resistance or gave molded products accompanied with bleeding and were able to provide dissatisfactory sealed electronic devices only.

PTK in Example 14, to 25 wt. % of the PPS and 75 wt. % of the PTK in Example 15 and to the PTK alone in Example 16, test pieces and sealed electronic devices were molded and were similarly evaluated.

COMPARATIVE EXAMPLES 6–7

In a similar manner to Example 12 except for the changes that the proportion of the silicone rubber was changed to 5 parts by weight in Comparative Example 6 and to 20 parts by weight in Comparative Example 7, test pieces and sealed electronic devices were molded and were similarly evaluated.

COMPARATIVE EXAMPLE 8

In a similar manner to Example 12 except that the proportions of the thermoplastic resin components were changed to the PPS alone, test pieces and sealed electronic devices were molded and were similarly evaluated.

The measurement results of Examples 12-16 and Comparative Examples 6-8 are given in Table 3.

As will be envisaged from Table 3, the resin compositions according to the invention are excellent in moisture resistance, moldability and the like.

changes to 70 wt. % of the PPS and 30 wt. % of the PTK in Example 19, to 25 wt. % of the PPS and 75 wt. % of the PTK in Example 20 and to the PTK alone in Example 21, test pieces and sealed electronic devices were molded and were similarly evaluated.

COMPARATIVE EXAMPLES 9-10

TABLE 3

|  | Example | | | | | Comparative Example | | |
|---|---|---|---|---|---|---|---|---|
|  | 12 | 13 | 14 | 15 | 16 | 6 | 7 | 8 |
| Resin component (parts) | 35 | 35 | 35 | 35 | 35 | 35 | 35 | 35 |
| PTK (%) | 50 | 50 | 30 | 75 | 100 | 50 | 50 | 0 |
| PPS (%) | 50 | 50 | 70 | 25 | 0 | 50 | 50 | 100 |
| Inorganic filler | | | | | | | | |
| Silica (parts) | 65 | 65 | 65 | 65 | 65 | 65 | 65 | 65 |
| Silicone rubber (parts) | 10 | 15 | 10 | 10 | 10 | 5 | 20 | 10 |
| Physical properties of composition | | | | | | | | |
| Melt viscosity (poise) | 410 | 420 | 410 | 410 | 420 | 400 | 440 | 410 |
| Flexural strength (kg/mm$^2$) | 3.5 | 3.1 | 3.5 | 3.5 | 3.5 | 4.4 | 2.8 | 3.5 |
| Modulus of flexural elasticity (kg/mm$^2$) | 1050 | 850 | 1050 | 1050 | 1050 | 1300 | 700 | 1050 |
| Solder heat resistant temperature (°C.) | 300 | 300 | 280 | 310 | 330 | 300 | 290 | 260 |
| Moisture resistance test | | | | | | | | |
| Method A | A | A | A | A | A | C | B | A |
| Method B | A | A | A | A | A | C | B | A |
| Wire sweep upon sealing (presence or absence?) | A | A | A | A | A | A | B | A |
| Damages to the package upon cutting lead frames (occurred or not occurred?) | A | A | A | A | A | A | B | A |

(All "%" and "parts" are by weight.)

EXAMPLE 17

In a similar manner to Example 6 except that 2 parts by weight of a silicone oil (of the same kind as that employed in Example 1) and 10 parts by weight of a silicone rubber (of the same kind as that used in Example 12) were blended to 100 parts by weight of the composition formed by mixing 65 parts by weight of silica with 35 parts by weight of a mixture consisting of 50 wt. % of the PPS and 50 wt. % of the PTK, the resulting blend was formed into pellets by means of a twin-screw extruder. Furthermore, test pieces and sealed electronic devices were similarly molded and evaluated.

EXAMPLES 18-21

In a similar manner to Example 17 except for the changes that the proportion of the silicone oil and silicone rubber were changed to 3 parts by weight and 9 parts by weight respectively in Example 18, the proportions of the thermoplastic resin components were In a similar manner to Example 17 except that the proportion of the silicone oil and silicone rubber were changed to 5 parts by weight and 10 parts by weight respectively in Comparative Example 9 and to 3 parts by weight and 15 parts by weight respectively in Comparative Example 10, test pieces and sealed electronic devices were molded and were similarly evaluated.

COMPARATIVE EXAMPLE 11

In a similar manner to Example 17 except that the proportions of the thermoplastic resins were changed to the PPS alone, test pieces and sealed electronic devices were molded and were similarly evaluated.

The measurement results of Examples 17-21 and Comparative Examples 9-11 are shown in Table 4.

As will become apparent from Table 4, the resin compositions according to the invention have excellent balancing among physical properties and moisture resistance as the compositions, the surface quality as molded products, and wire sweep upon sealing and damages to the package upon cutting the lead frame.

TABLE 4

|  | Example | | | | | Comparative Example | | |
|---|---|---|---|---|---|---|---|---|
|  | 17 | 18 | 19 | 20 | 21 | 9 | 10 | 11 |
| Resin component (parts) | 35 | 35 | 35 | 35 | 35 | 35 | 35 | 35 |
| PTK (%) | 50 | 50 | 30 | 75 | 100 | 50 | 50 | 0 |
| PPS (%) | 50 | 50 | 70 | 25 | 0 | 50 | 50 | 100 |
| Inorganic filler | | | | | | | | |
| Silica (parts) | 65 | 65 | 65 | 65 | 65 | 65 | 65 | 65 |
| Silicone oil (parts) | 2 | 3 | 2 | 2 | 2 | 5 | 3 | 2 |
| Silicone rubber (parts) | 10 | 9 | 10 | 10 | 10 | 10 | 15 | 10 |
| Physical properties of composition | | | | | | | | |
| Melt viscosity (poise) | 400 | 390 | 400 | 400 | 410 | 380 | 400 | 400 |
| Flexural strength (kg/mm$^2$) | 3.1 | 3.3 | 3.1 | 3.1 | 3.1 | 2.8 | 2.7 | 3.1 |
| Modulus of flexural elasticity (kg/mm$^2$) | 900 | 950 | 900 | 900 | 900 | 800 | 750 | 900 |
| Solder heat resistant | 300 | 300 | 280 | 310 | 330 | 300 | 290 | 260 |

TABLE 4-continued

|  | Example | | | | | Comparative Example | | |
| --- | --- | --- | --- | --- | --- | --- | --- | --- |
|  | 17 | 18 | 19 | 20 | 21 | 9 | 10 | 11 |
| temperature (°C.) | | | | | | | | |
| Moisture resistance test | | | | | | | | |
| Method A | A | A | A | A | A | A | A | A |
| Method B | A | A | A | A | A | B | B | A |
| Surface quality of molded product (bleeding) | A | A | A | A | A | B | A | A |
| Wire sweep upon sealing (presence or absence?) | A | A | A | A | A | A | A | A |
| Damages to the package upon cutting lead frames (occurred or not occurred?) | A | A | A | A | A | B | B | A |

(All "%" and "parts" are by weight.)

What is claimed is:

1. An electronic device sealing resin composition comprising:
   (A) 40-25 parts by weight of a thermoplastic resin composed of (i) 100-10 wt. % of a poly(arylene thioether-ketone) having at least 50 wt. % of recurring units of the formula

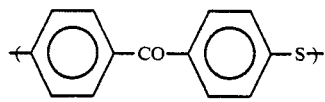

wherein the —CO— and —S— are in the para position to each other, and having the following physical properties (a)-(c):
   (a) a melting point, Tm, of 310°-380° C.;
   (b) a melt crystallization temperature, Tmc (420° C./10 min), of at least 210° C., and a residual melt crystallization enthalphy, $\Delta$ Hmc (420° C./10 min) of at least 10 J/g, wherein $\Delta$Hmc (420° C./10 min) and Tmc (420° C./10 min) are determined by a differential scanning calorimeter at a cooling rate of 10° C./min. after the poly(arylene thioether-ketone) is held at 50° C. for 5 minutes in an inert gas atmosphere, heated to 420° C. at a rate of 75° C./min and then held for 10 minutes at 420° C.; and
   (c) a reduced viscosity, $\eta_{red}$ being 0.2-2 dl/g as determined by viscosity measurement at 25° C. and a polymer concentration of 0.5 g/dl in 98% by weight sulfuric acid; and (ii) 0-90 wt. % of a poly(arylene sulfide) containing at least 50 wt. % of recurring units of the formula

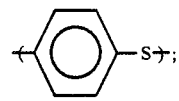

(B) 60-75 parts by weight of silica; and
   (C) 1.5-5 parts by weight, per 100 parts by weight of the thermoplastic resin (A) and the silica (B) combined, of a silicone oil having a viscosity of 10-10,000 centistokes at 25° C.

2. The electronic device sealing resin composition as claimed in claim 1, wherein the thermoplastic resin is composed of 100-30 wt. % of the poly(arylene thioether-ketone) and 0-70 wt. % of the poly(arylene sulfide).

3. The electronic device sealing resin composition as claimed in claim 1, wherein the thermoplastic resin is composed of 100-50 wt. % of the poly(arylene thioether-ketone) and 0-50 wt. % of the poly(arylene sulfide).

4. The electronic device sealing resin composition as claimed in claim 1 wherein the thermoplastic resin is composed of 50-10 wt. % of the poly(arylene thioether-ketone) and 50-90 wt. % of the poly(arylene sulfide).

5. The electronic device sealing resin composition as claimed in claim 1, wherein the poly(arylene thioether-ketone) has at least 60 wt. % of said first recurring units.

6. The electronic device sealing resin composition as claimed in claim 1, wherein the poly(arylene sulfide) contains at least 70 wt. % of said second recurring units.

7. The electronic device sealing resin composition as claimed in claim 1, wherein the poly(arylene thioether-ketone) has at least 70 weight % of said first recurring units.

8. The electronic device sealing resin composition as claimed in claim 1, wherein the poly(arylene sulfide) contains at least 90 weight % of said second recurring units.

* * * * *